(12) United States Patent
Hwang

(10) Patent No.: US 6,621,111 B2
(45) Date of Patent: Sep. 16, 2003

(54) CAPACITOR STRUCTURE OF SEMICONDUCTOR DEVICE AND METHOD FOR FORMING THE SAME

(75) Inventor: Ho-Ik Hwang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/279,682

(22) Filed: Oct. 24, 2002

(65) Prior Publication Data

US 2003/0104668 A1 Jun. 5, 2003

(30) Foreign Application Priority Data

Dec. 3, 2001 (KR) .................... 10-2001-75862

(51) Int. Cl.[7] .................... H01L 27/108; H01L 21/8242
(52) U.S. Cl. .................... 257/296; 257/532; 438/251; 438/252
(58) Field of Search .................... 257/296, 311, 257/313, 532; 438/250, 251, 252

(56) References Cited

U.S. PATENT DOCUMENTS

| | | | | |
|---|---|---|---|---|
| 4,295,264 A | * | 10/1981 | Rogers | 438/394 |
| 4,466,177 A | * | 8/1984 | Chao | 438/251 |
| 5,071,784 A | * | 12/1991 | Takeuchi et al. | 438/241 |
| 5,883,408 A | * | 3/1999 | Tsukamoto | 257/296 |
| 6,057,203 A | * | 5/2000 | Wong | 438/381 |
| 6,057,572 A | * | 5/2000 | Ito et al. | 257/296 |

OTHER PUBLICATIONS

Grove, Andrew S. "Physics and Technology of Semiconductor Devices," John Wiley & Sons, Inc. 1967, pp. 191–201.

* cited by examiner

*Primary Examiner*—T. N. Quach
(74) *Attorney, Agent, or Firm*—Mills & Onello, LLP

(57) ABSTRACT

A capacitor structure includes a device isolation layer pattern formed at a predetermined region of a semiconductor substrate to define an active region; an upper electrode disposed over an upper center of the active region to expose an edge of the active region; a lower electrode region formed in the active region under the upper electrode; and a lightly doped region overlapping with an outer edge of the lower electrode region. In this manner, the resulting breakdown voltage of the device can be increased.

19 Claims, 7 Drawing Sheets

CAPACITOR STRUCTURE OF SEMICONDUCTOR DEVICE AND METHOD FOR FORMING THE SAME

RELATED APPLICATION

This application relies for priority upon Korean Patent Application No. 2001-75862, filed on Dec. 3, 2001, the contents of which are herein incorporated by reference in their entirety.

FIELD OF THE INVENTION

The present invention relates to a semiconductor device and a method for forming the same and, more particularly, to a MOS-type capacitor structure that can increase a breakdown voltage between a junction region and a well region, and a method for forming the same.

BACKGROUND OF THE INVENTION

Semiconductor devices commonly include a capacitor that comprises a pair of conductive layers and a dielectric layer therebetween. There are typically two kinds of capacitors that are used in semiconductor devices. One is a metal-insulator-metal (MIM) type capacitor that comprises a pair of separated metal plates and an insulation layer therebetween. The other is a metal-oxide-semiconductor (MOS) type capacitor that comprises a semiconductor substrate, a conductive layer formed thereon, and an insulation layer between the substrate and the conductive layer.

The MIM-type capacitor has desirable characteristics that make it an ideal capacitor for the most part. The MIM-type capacitor offers the advantage of the ability to maintain positive and negative electric charges. However, in the MIM-type capacitor, the insulation layer between the metal plates is formed using a chemical vapor deposition (CVD) technique. Accordingly, the insulation layer of the MIM-type capacitor is formed thicker than that of the insulation layer of the MOS-type capacitor, and it is therefore difficult to precisely adjust its resulting thickness.

In comparison with the MIM-type capacitor, the MOS-type capacitor generally employs a gate oxide layer formed during fabrication of a MOS transistor as the dielectric layer. The gate oxide layer is formed by thermally oxidizing the semiconductor substrate, which is a well-known and stable fabricating technique. Thus, the dielectric layer of the MOS-type capacitor may be formed to a relatively thin thickness and also exhibits improved insulating characteristics.

In another approach, the capacitance of a capacitor is proportional to the respective surface areas of the conductive layers and inversely proportional to the space between the conductive layers, i.e., the thickness of the dielectric layer. Thus, in the case where the dielectric layer is relatively thick, the conductive layers should be formed to have large areas in order to provide sufficient capacitance in the capacitor. In this respect, the MOS-type capacitor is more advantageous, in view of the formation of the thin dielectric layer, as compared with the MIM-type capacitor.

FIGS. 1, 2A, and 2B are a top plan view and cross-sectional views for illustrating the conventional MOS-type capacitor. FIGS. 2A and 2B are the cross-sectional views taken along lines 1–1' and 2–2' of FIG. 1, respectively.

Referring to FIGS. 1, 2A, and 2B, a device isolation layer pattern 12 is formed at a predetermined region of the semiconductor substrate 10 to define an active region. A lower electrode region 20 is formed in the active region using an ion implantation process. At this time, the lower electrode region 20 serves as one conductive layer of the MOS-type capacitor and crosses the active region in one direction. That is, as shown in FIG. 2B, the lower electrode region 20 is in contact with sidewalls of the device isolation layer patterns 12 in one direction (e.g., 2–2' direction of FIG. 1).

A gate oxide layer 14 is disposed on the active region where the lower electrode region 20 is formed. An upper electrode 16 overlaps with the device isolation layer pattern 12 across the gate oxide layer 14, thereby constituting the other conductive layer of the MOS-type capacitor. In this case, the lower electrode region 20 protrudes, as shown in FIG. 2A, toward both sides of the upper electrode 16. A lightly doped region 22 is then formed in the active region of the both sides of the upper electrode 16 to overlap with an edge of the lower electrode region 20, which protrudes toward sides of the upper electrode 16.

At this time, the lower electrode region 20 has a rounded edge 99 similar to an impurity region formed by using a conventional ion implantation process. The rounded edge 99 arises in a region where the lower electrode region 20 is in contact with the device isolation layer pattern 12. In the event that a voltage is applied to the lower electrode region 20, an electric field is concentrated at the rounded edge 99. Thus, a junction breakdown arises at the rounded edge 99 earlier than at the planar bottom surface of the lower electrode region 20. As a result, the aforementioned conventional capacitor structure suffers from a decrease in the junction breakdown voltage.

With reference to "PHYSICS AND TECHNOLOGY OF SEMICONDUCTOR DEVICES", pages 191–201, by Andrew S. Grove, published in 1967 by John Wiley & Sons, Inc., the breakdown voltage of the device is influenced by the shape of the lower electrode region 20 as well the impurity concentration in the lower electrode region 20. According to Grove, to increase the breakdown voltage, it is preferable to lower the concentration of the impurity region and to form the impurity region into a gentle shape.

SUMMARY OF THE INVENTION

It is therefore a feature of the present invention to provide a MOS-type capacitor using a junction region, of which breakdown voltage is high, as a lower electrode.

It is another feature of the present invention to provide a method for forming the MOS-type capacitor, so as to increase the breakdown voltage of the junction region that is used as the lower electrode.

The present invention provides a capacitor structure of a semiconductor device that includes a lightly doped region formed to overlap with an outer edge of a lower electrode region. The capacitor structure comprises a device isolation layer pattern, an upper electrode, a lower electrode region, and a lightly doped region. The device isolation layer pattern is formed at a predetermined region of the semiconductor substrate to define an active region. The upper electrode is disposed above the active region to expose the active region about the upper electrode. The lower electrode region is formed in the active region below the upper electrode such that the upper electrode is positioned above the lower electrode and within an outer edge of the lower electrode. The lightly doped region is formed in the active region at the outer edge of the lower electrode and the device isolation pattern, such that the lightly doped region overlaps with the outer edge of the lower electrode.

A capacitor dielectric layer may optionally be positioned between the active region and the upper electrode. The lightly doped region is preferably formed to a greater depth than the lower electrode region.

A heavily doped region may be disposed within the lightly doped region. The lightly doped region, the lower electrode region, and the heavily doped region include impurities having a conductivity type that is different than that of the active region.

The present invention also provides a method for forming a capacitor structure of a semiconductor device, which includes forming a lightly doped region that overlaps with an edge of a lower electrode region. The method comprises forming a device isolation pattern in a predetermined region of a semiconductor substrate to define an active region; forming a lower electrode in the active region; forming an upper electrode over the active region positioned above the lower electrode and within an outer edge of the lower electrode; and forming a lightly doped region in the active region adjacent the upper electrode between the outer edge of the lower electrode and the device isolation pattern, wherein the lightly doped region is formed to overlap with the outer edge of the lower electrode.

The method may further comprise forming a capacitor dielectric layer on the active region after forming the lower electrode. In this case, the capacitor dielectric layer is formed by thermally oxidizing the active region.

The lightly doped region is preferably formed deeper than the lower electrode region so as to surround the edge of the lower electrode region. Preferably, the method further comprises forming a heavily doped region within the lightly doped region after forming the lightly doped region. The lower electrode region, the lightly doped region, and the heavily doped region are formed to include impurities having a conductivity type that is different than that of the active region.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENT

Figure 1:
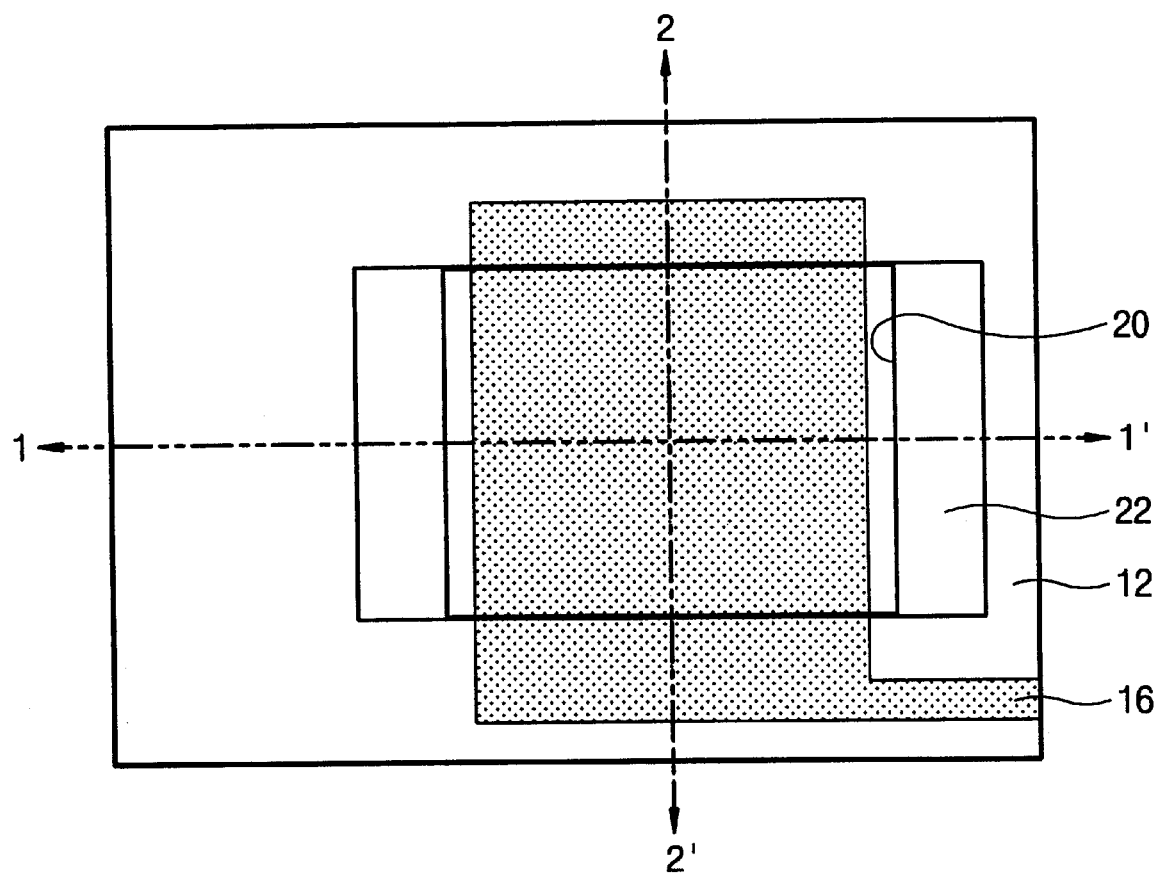
FIG. 1 is a top plan view of a MOS-type capacitor according to a conventional configuration.
Figure 2A:
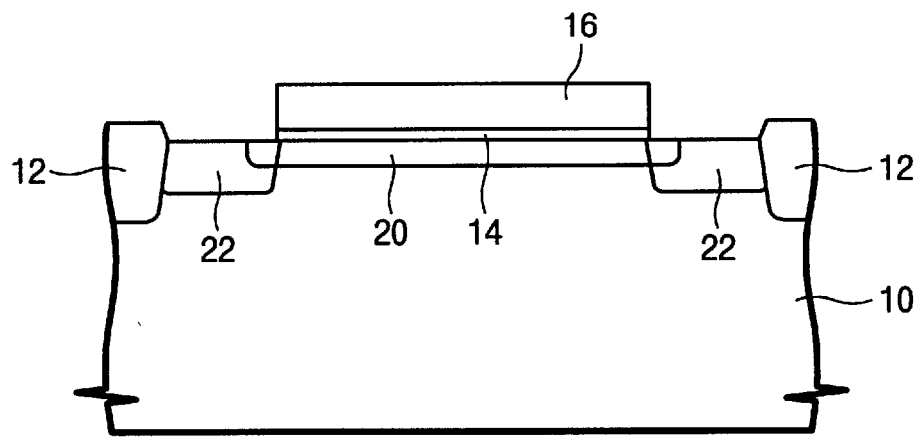
FIGS. 2A and 2B are cross-sectional views of the MOS-type capacitor according to the conventional configuration.
Figure 2B:
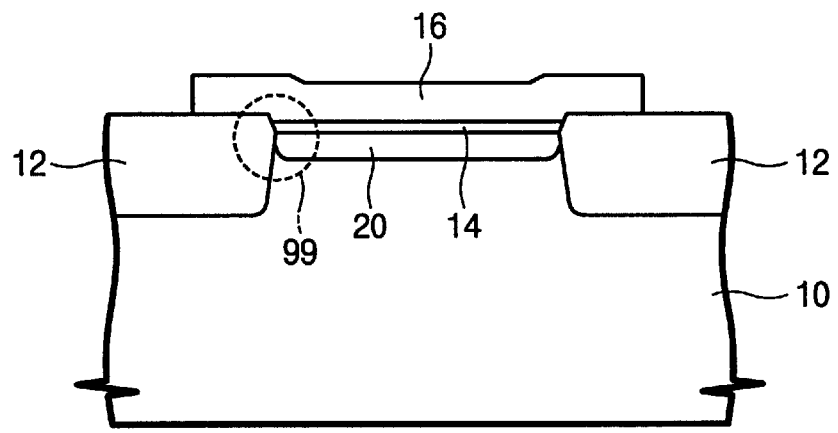

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 3:
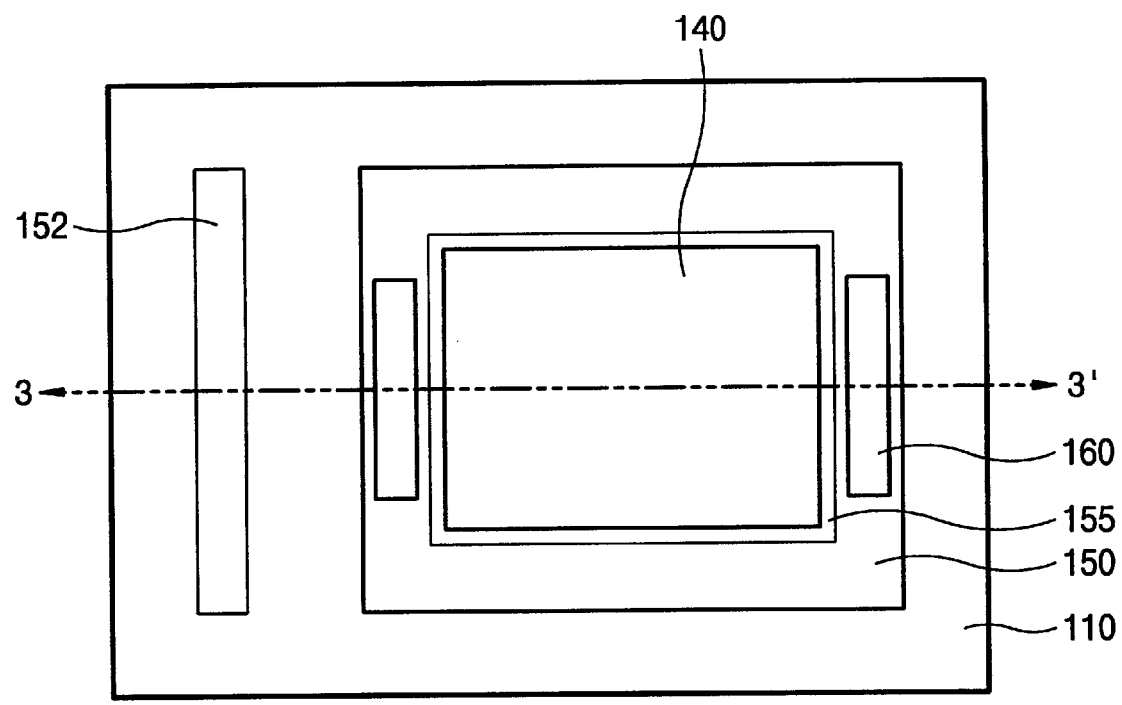
FIG. 3 is a top plan view of a MOS-type capacitor structure according to a preferred embodiment of the present invention.
Figure 4:
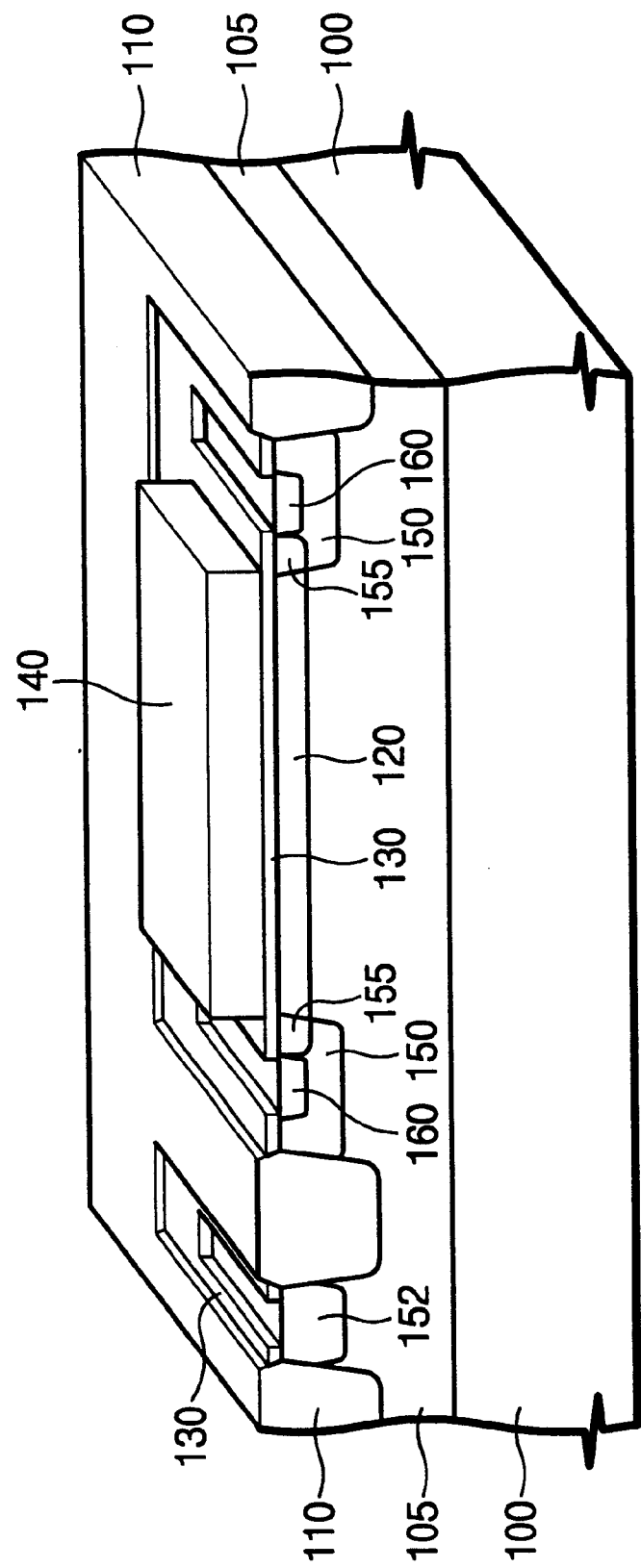
FIG. 4 is a perspective view of the MOS-type capacitor structure according to the preferred embodiment of the present invention.

FIGS. 3 and 4 are a top plan view and a perspective view, respectively, for illustrating a MOS-type capacitor structure of a preferred embodiment of the present invention.

Referring to FIGS. 3 and 4, a device isolation layer pattern 110 is formed at a predetermined region of a semiconductor substrate 100 to define an active region. A lower electrode region 120 is disposed in the active region to have an edge that is separated from the device isolation layer pattern 110.

Thus, the lower electrode region 120 is formed to have a smaller area than that of the active region. A capacitor dielectric layer 130 is formed on the lower electrode region 120 to serve as a dielectric layer of the MOS-type capacitor according to the present invention.

An upper electrode 140 is disposed on the capacitor dielectric layer 130. The distance from an edge of the upper electrode 140 to the device isolation layer pattern 110 is larger than the distance from the edge of the lower electrode region 120 to the device isolation layer pattern 110. Thus, the upper electrode 140 is formed on the capacitor dielectric layer 130 to have a smaller area than the lower electrode region 120. That is, in the top plan view, the outer edge of the lower electrode region 120 forms a closed curve between the upper electrode 140 and the device isolation layer pattern 110. The upper electrode 140 is preferably made of polysilicon including impurities so as to exhibit conductivity.

A lightly doped region 150 is disposed in the active region adjacent to the upper electrode 140. The lightly doped region 150 overlaps with the edge of the lower electrode region 120. That is, the lightly doped region 150 has an overlapped impurity region 155 in common with the lower electrode region 120. The lightly doped region 150 is formed to a larger depth from the top surface of the semiconductor substrate 100 than the lower electrode region 120. Thus, the edge of the lower electrode region 120 is surrounded by the lightly doped region 150 having lower impurity concentration, enabling minimization of the electric field concentration. In addition, a heavily doped region 160 may optionally be formed within the lightly doped region 150.

Preferably, a well region 105 is disposed in an upper portion of the semiconductor substrate 100 to surround bottom surfaces of both the lower electrode region 120 and the lightly doped region 150. The well region 105 includes impurities of a first conductivity type, while the lower electrode region 120 and the lightly doped region 150 preferably include impurities of an opposite, second, conductivity type. In addition, it is preferable that the heavily doped region 160 includes impurities having a conductivity type that is the same as that of the lightly doped region 150, i.e., impurities of second conductivity type. While, in the above example, the lightly doped region 150, the heavily doped region 160, and the lower electrode region 120 include impurities of the same conductivity type, the respective impurities may alternatively be of different types.

Meanwhile, a well bias region 152 may be additionally formed in the well region 105 to apply a voltage so that the lightly doped region 150, the heavily doped region 160, and the lower electrode region 120 can form a PN junction with the well region 105. The well bias region 152 preferably includes high-concentration impurities of a conductivity type that is the same as that of the well region 105, i.e., impurities of first conductivity type.

Figure 5:
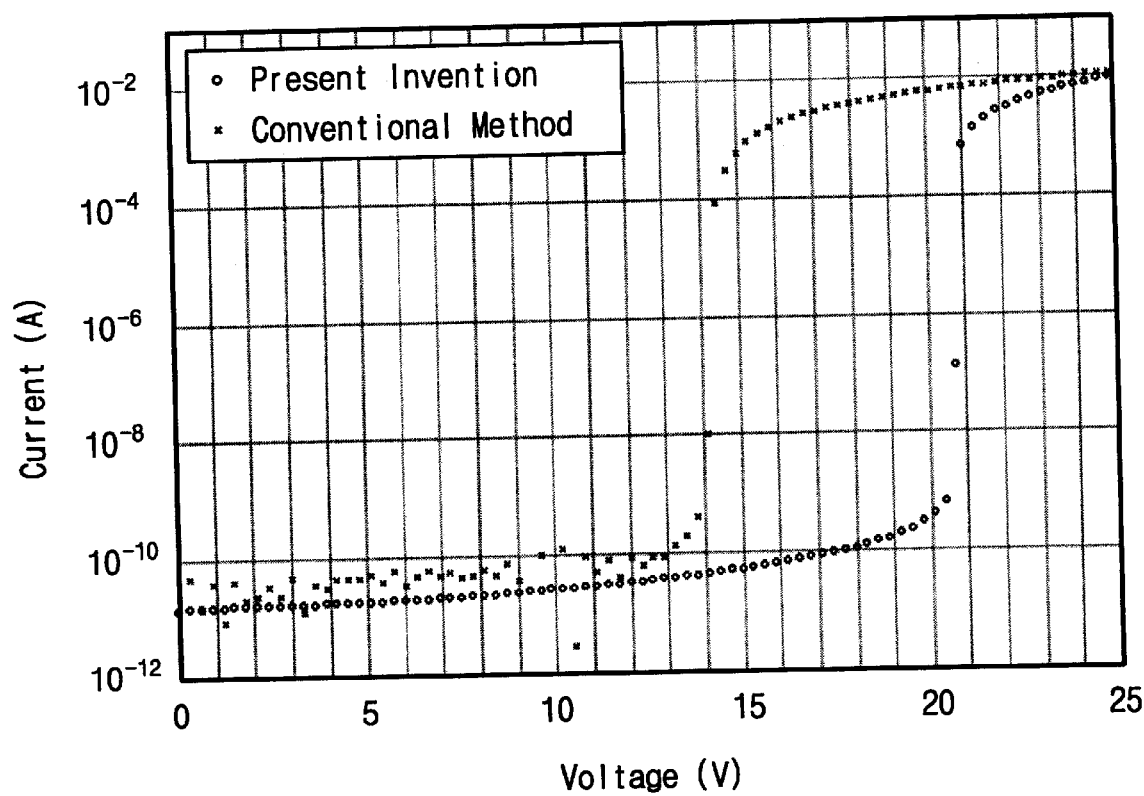
FIG. 5 is a graph showing characteristics of the MOS-type capacitor structure according to the present invention.

FIG. 5 is a graph for illustrating characteristics of the capacitor structure according to the present invention, which shows the results obtained from measurement of the breakdown voltage of the lower electrode of the MOS-type capacitor that forms the PN junction with the well region.

Referring to FIG. 5, in the case of the conventional configuration, an experiment was conducted using the MOS-type capacitor as shown in FIG. 1. In the case of the configuration of the present invention, employed was the capacitor structure as shown in FIGS. 3 and 4. In the present experiment, however, the MOS-type capacitor structure according to the conventional approach also included a well region 105, a well bias region 152, and a heavily doped region 160, as in the MOS-type capacitor structure of the present invention. Therefore, the structural difference between the two MOS-type capacitors in the experiment lies in that the conventional MOS-type capacitor includes a region where the edge of the lower electrode region 20 does not overlap with the lightly doped region 22 in one direction (2–2' direction of FIG. 1), unlike the MOS-type capacitor of the present invention.

As the result of the measurement, the breakdown voltages of the lower electrode regions 120 of the MOS-type capacitors according to the conventional method and present invention were 14 and 21V, respectively. Accordingly, it was confirmed that the lower electrode region 120 of the MOS-type capacitor of the present invention exhibits a higher breakdown voltage than that of the conventional MOS-type capacitor.

FIGS. 6 through 9 are cross-sectional views for illustrating the method for forming the MOS-type capacitor structure according to the preferred embodiment of the present invention, the cross-sectional views being taken along line 3–3' of FIG. 3.

Figure 6:
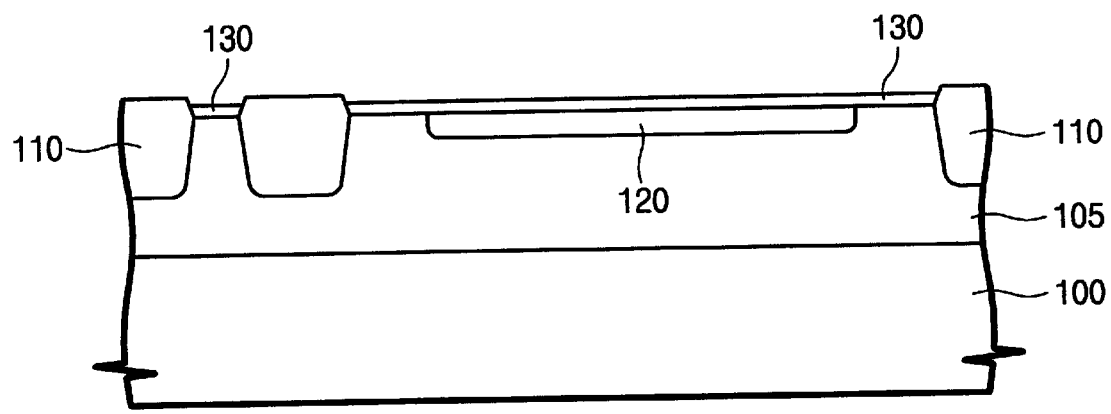
FIGS. 6 through 9 are cross-sectional views for illustrating a method for forming the MOS-type capacitor structure according to the preferred embodiment of the present invention.

Referring to FIG. 6, a well region 105 of first conductivity type is formed on a predetermined region of the semiconductor substrate 100. A device isolation layer 110 is formed in the semiconductor substrate 100 including the well region 105 to define first and second active regions. A lower electrode region 120 is formed in the central region of the first active region. A capacitor dielectric layer 130 is formed on the second active region as well as the first active region where the lower electrode region 120 is formed.

In subsequent processes, the MOS-type capacitor of the present invention is formed in the first active region, and the well bias region is formed in the second active region to apply a voltage.

The lower electrode region 120 is formed by performing an ion implantation process using the impurities of the second conductivity type. In the ion implantation process, it is preferable that, after forming a buffer oxide layer (not shown) on the semiconductor substrate 100, the buffer oxide layer is used to prevent ion channeling.

The lower electrode region 120 is disposed in the center of the first active region so as to have an edge that is separated from the device isolation layer pattern 110. For this, the ion implantation process for forming the lower electrode region 120 comprises forming a photoresist pattern (not shown) to expose the center of the first active region, the photoresist pattern then being used as an ion implantation mask.

The semiconductor device of the present invention may include structures other than the capacitor structure as described in the present invention, such as various kinds of transistors, resistance structures, and interconnections, for example. In this case, the lower electrode region 120 of the present invention is compatible with fabricating processes of the transistors of the semiconductor device. More specifically, the semiconductor device normally includes a depletion-mode MOSFET. Thus, it is not necessary to undergo any additional process for forming the lower electrode region 120. Namely, the lower electrode region 120 may be formed using an ion implantation process for formation of the depletion region, which is carried out during the fabricating process of the depletion mode MOSFET. By forming the lower electrode region 120 without additional fabricating steps, fabrication costs can be reduced.

Prior to forming the capacitor dielectric layer 130, the buffer oxide layer is removed to expose top surfaces of the active regions. Thereafter, the capacitor dielectric layer 130 is preferably formed by thermally oxidizing the top surfaces of the active regions. The capacitor dielectric layer 130 is preferably formed using processes such as those used for forming a MOSFET gate oxide layer (not shown). Like the lower electrode region 120, since the capacitor dielectric layer 130 is compatible with formation processes of the gate oxide layers, the fabrication costs of the semiconductor device can be reduced.

Figure 7:
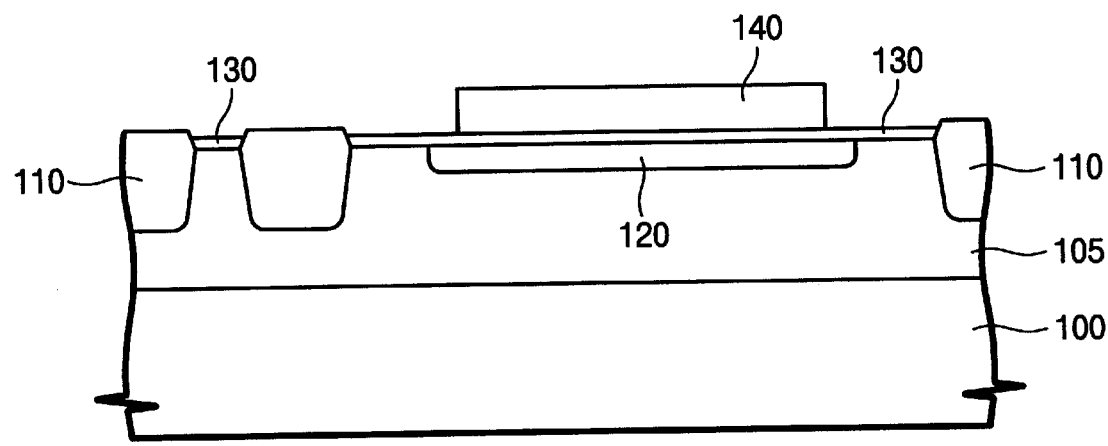

Referring to FIG. 7, after forming a conductive layer (not shown) on an entire surface of the semiconductor substrate having the capacitor dielectric layer 130, the conductive layer is patterned to form an upper electrode 140.

In the top plan view, the upper electrode 140 is preferably formed to expose the outer perimeter edge of the lower electrode region 120. In view of this, the lateral distance from the edge of the upper electrode 140 to the device isolation layer pattern 110 is greater than the distance from the edge of the lower electrode region 120 to the device isolation layer pattern 110. Thus, the upper electrode 140 is formed on the capacitor dielectric layer 130 to have a smaller area than that of the lower electrode region 120.

The conductive layer is preferably formed of polysilicon including impurities so as to exhibit conductivity. Forming the upper electrode 140 preferably comprises forming a first mask pattern (not shown) on the conductive layer, then performing an anisotropic etch process using the first mask pattern as an etch mask. Before forming the first mask pattern, another conductive layer or an insulation layer may be further stacked on the conductive layer, and the upper electrode may be then formed. The etching process for forming the upper electrode 140 is performed using an etch recipe having an etch selectivity with respect to the capacitor dielectric layer 130.

Figure 8:
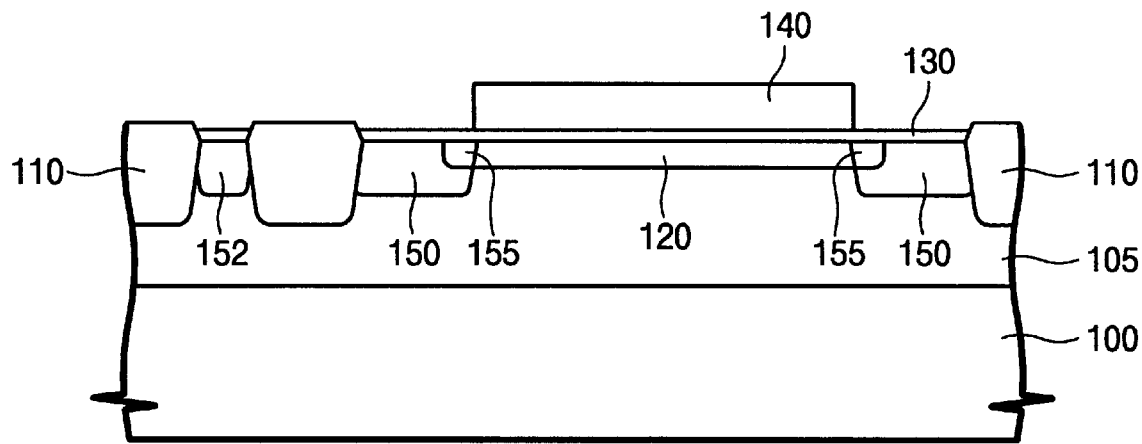

Referring to FIG. 8, a second mask pattern is formed on the semiconductor substrate having the upper electrode 140 to cover a predetermined region including the second active region. By using the second mask pattern and the upper electrode 140 as a mask, an ion implantation process is carried out to form a lightly doped region 150 in the first active region adjacent the upper electrode 140.

As a result, the lightly doped region 150 is formed to overlap with the edge of the low electrode region 120. That is, an overlapped impurity region 155 where the lightly doped region 150 overlaps with the low electrode region 120 is formed about all sides of the upper electrode 140. At this time, as described above, it is preferable that the lightly doped region 150 is formed deeper than the lower electrode region 120 in order to prevent a decrease in the breakdown voltage, which otherwise would be caused by the rounded edge of the lower electrode region 120 being in direct contact with the well region 105. Thus, the planar, bottom surface of the lower electrode region 120 is in contact with the well region 105, while the rounded edge of the lower electrode region 120 is in communication with, and encompassed by, the lightly doped region 150.

In addition, the lightly doped region 150 is formed to include impurities of which conductivity type is different from the well region 105, i.e., impurities of second conductivity type such that the lightly doped region 150 and the well region 105 form a PN junction. Meanwhile, a well bias region 152 including high-concentration impurities, of which conductivity type is the same as the well region 105, is formed in the second active region so as to apply a forward bias voltage to the well region 105. Therefore, the well bias region 152 is preferably formed by performing an ion implantation process using the impurities of first conductivity type.

Figure 9:
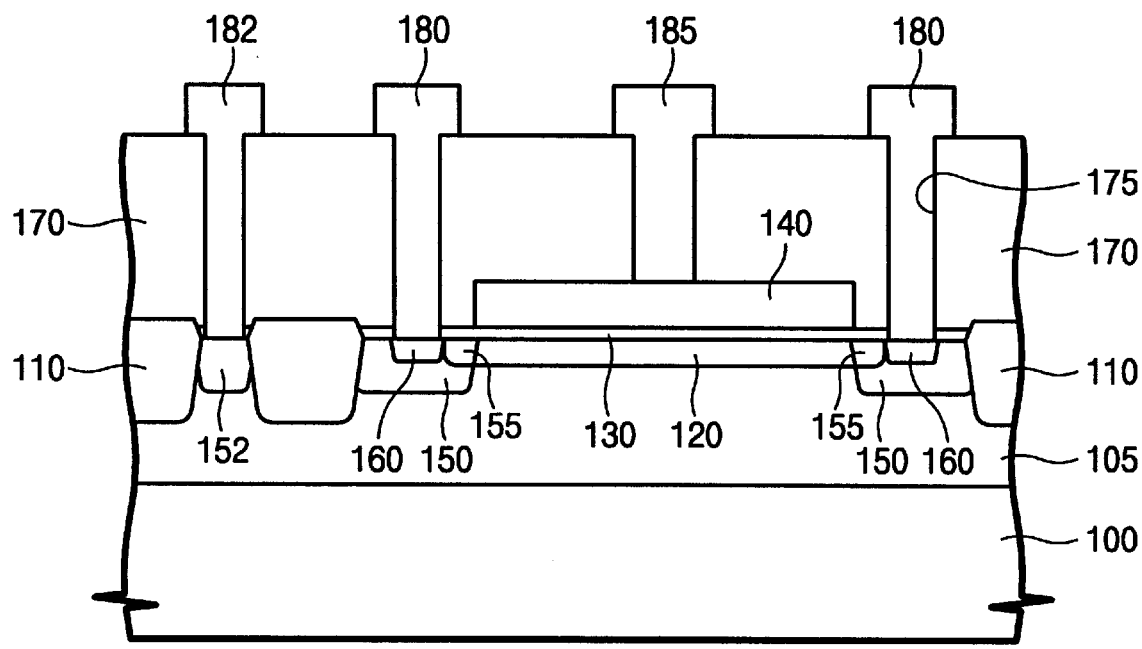

Referring to FIG. 9, a heavily doped region 160 is formed within the lightly doped region 150. After forming an interlayer insulation layer 170 on an entire surface of the semiconductor substrate having the heavily doped region 160, the interlayer insulation layer 170 is patterned to form openings 175, exposing top surfaces of the heavily doped region 160, the upper electrode 140, and the well bias region 152. Through the openings 175, a conductive pattern 180 for the lower electrode, a conductive pattern 185 for the upper electrode, and a well bias conductive pattern 182 are formed to be connected to the heavily doped region 160, the upper electrode 140, and the well bias region 152, respectively.

The heavily doped region 160 is preferably formed shallower than the lightly doped region 150. Thus, the heavily doped region 160 is surrounded by the lightly doped region 150 to form into a DDD structure.

The interlayer insulation layer 170, the opening 175, and the conductive patterns 180, 182, and 185 may be formed as known to those skilled in the art.

According to the present invention, the lightly doped region is formed to overlap with the edge of the lower electrode region. Thus, the configuration of the present invention mitigates or prevents concentration of an electric field at the outer edge of the lower electrode region. As a result, the lower electrode, which is formed as an impurity region, exhibits an increased breakdown voltage.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method for forming a capacitor structure of a semiconductor device comprising:

forming a device isolation pattern in a predetermined region of a semiconductor substrate to define an active region;

forming a lower electrode in the active region;

forming an upper electrode over the active region positioned above the lower electrode and within an outer edge of the lower electrode; and forming a lightly doped region in the active region adjacent the upper electrode between the outer edge of the lower electrode and the device isolation pattern, wherein the lightly doped region is formed to overlap with the outer edge of the lower electrode.

2. The method as claimed in claim 1, wherein forming the lower electrode is followed by forming a capacitor dielectric layer in the active region.

3. The method as claimed in claim 2, wherein the capacitor dielectric layer is formed by thermally oxidizing the active region.

4. The method as claimed in claim 1, wherein the lightly doped region is formed to a depth that is greater than that of the lower electrode.

5. The method as claimed in claim 1, wherein the lower electrode is formed to include impurities having a conductivity type that is different than that of the active region.

6. The method as claimed in claim 1, wherein the lightly doped region is formed to include impurities having a conductivity type that is different than that of the active region.

7. The method as claimed in claim 1, wherein forming the lightly doped region is followed by forming a heavily doped region within the lightly doped region.

8. The method as claimed in claim 7, wherein the heavily doped region is formed to include impurities having a conductivity type that is different than that of the active region.

9. The method as claimed in claim 1, wherein the upper electrode comprises polysilicon including impurities.

10. A capacitor structure of a semiconductor device comprising:

a device isolation pattern formed in a predetermined region of a semiconductor substrate, the'device isolation pattern defining an active region;

an upper electrode formed over the active region, the upper electrode exposing a portion of the active region about the upper electrode;

a lower electrode formed in the active region below the upper electrode, such that the upper electrode is positioned above the lower electrode and within an outer edge of the lower electrode; and a lightly doped region in the active region at the outer edge of the lower electrode and the device isolation pattern, the lightly doped region overlapping with the outer edge of the lower electrode.

11. The structure as claimed in claim 10, wherein the lower electrode has a larger area that of the upper electrode.

12. The structure as claimed in claim 10, wherein the lightly doped region is formed in the active region between the device isolation pattern and the upper electrode.

13. The structure as claimed in claim 10, further comprising a capacitor dielectric layer between the active region and the upper electrode.

14. The structure as claimed in claim 10, wherein a heavily doped region is disposed within the lightly doped region.

15. The structure as claimed in claim 14, wherein the heavily doped region includes impurities of a conductivity type that is different than that of the active region.

16. The structure as claimed in claim 10, wherein the lightly doped region includes impurities of a conductivity type that is different than that of the active region.

17. The structure as claimed in claim 10, wherein the lower electrode region includes impurities of a conductivity type that is different than that of the active region.

18. The structure as claimed in claim 10, wherein the lightly doped region is formed to a depth that is greater than that of the lower electrode.

19. The structure as claimed in claim 10, wherein the upper electrode comprises polysilicon including impurities.

* * * * *